United States Patent
Tagusa et al.

[19]

[11] Patent Number: 5,859,683
[45] Date of Patent: Jan. 12, 1999

[54] TRANSMISSIVE LIQUID CRYSTAL DISPLAY APPARATUS AND METHOD FOR PRODUCING THE SAME

[75] Inventors: Yasunobu Tagusa, Ikoma; Takayuki Shimada, Yamatokoriyama; Yuzuru Kanemori, Nara; Mikio Katayama, Ikoma, all of Japan

[73] Assignee: Sharp Kabushiki Kaisha, Osaka, Japan

[21] Appl. No.: 722,827

[22] Filed: Sep. 27, 1996

[30] Foreign Application Priority Data

Sep. 29, 1995 [JP] Japan ................................. 7-254044

[51] Int. Cl.⁶ ..................... G02F 1/1333; G02F 1/1343; G02F 1/136
[52] U.S. Cl. .............................. 349/138; 349/39; 349/44
[58] Field of Search ................. 349/138, 39, 44

[56] References Cited

U.S. PATENT DOCUMENTS

| | | | |
|---|---|---|---|
| 4,688,896 | 8/1987 | Castleberry . | |
| 5,032,883 | 7/1991 | Wakai et al. . | |
| 5,166,085 | 11/1992 | Wakai et al. ............................. | 257/59 |
| 5,335,102 | 8/1994 | Kanemori et al. . | |
| 5,500,750 | 3/1996 | Kanbe et al. ............................. | 349/138 |
| 5,585,951 | 12/1996 | Noda et al. ............................. | 349/122 |
| 5,594,571 | 1/1997 | Hanyu et al. ............................. | 349/138 |
| 5,641,974 | 6/1997 | Den Boer et al. ....................... | 349/138 |

FOREIGN PATENT DOCUMENTS

| | | | |
|---|---|---|---|
| 58-184929 | 10/1983 | Japan . | |
| 62-135810 | 6/1987 | Japan . | |
| 1-35351 | 7/1989 | Japan . | |
| 2-190826 | 7/1990 | Japan ................................. | 349/138 |
| 3-2826 | 1/1991 | Japan ................................. | 349/138 |
| 4307521 | 10/1992 | Japan . | |
| 4-74714 | 11/1992 | Japan . | |
| 6-230422 | 8/1994 | Japan . | |
| 7-36043 | 2/1995 | Japan . | |
| 7-122719 | 12/1995 | Japan . | |

OTHER PUBLICATIONS

Fujita et al, "Colorless Polyamide", Nitto Giho, vol. 29, No. 1, pp. 20–28, 1991.
Sakamoto et al, "27.3: A High–Aperture–Ratio 3–in.–Diagonal VGA a–Si Light Valve with Pixel/Data an Pixel/Gate Lines Overlapping", SIG 96 Digest, pp. 681–684, 1996.
Kim et al, "4:3: High–Aperture and Fault–Tolerant Pixel Strcutre for TFT–LCDs", SID 95 Digest, pp. 15–18, 1995.
"Application of a Wide Viewing Angle Technique Essential for a Large–Area Display to Mass Production Panel of TFT Starts", Flat–Panel Display '94, p. 166, 1993.
"Mass Production of CMP is Full–Fledged to be Applied to ASIC and DRAM", Nikkei Microdevices, pp. 50–57, 1994.
"Backlight", Flat–Panel Display '94, p. 217, 1993.

Primary Examiner—William L. Sikes
Assistant Examiner—Tiep H. Nguyen
Attorney, Agent, or Firm—Nixon & Vanderhye P.C.

[57] ABSTRACT

A transmissive liquid crystal display apparatus includes a liquid crystal layer interposed between a first substrate and a second substrate. The first substrate includes gate lines, source lines and switching devices provided in a vicinity of intersectional portions of the gate lines and the source lines. The switching devices include gate electrodes connected to the gate lines, source electrodes connected to the source lines and drain electrodes connected to pixel electrodes for applying a voltage to the liquid crystal layer. An interlayer insulating film having high transparency is provided above the switching devices, the gate lines and the source lines. The interlayer insulating film has roughness on its surface. A height difference of the roughness is 50 nm or less. The pixel electrode formed of a transparent conductive material is provided on the interlayer insulating film.

20 Claims, 9 Drawing Sheets

Horizontal direction

TRANSMISSIVE LIQUID CRYSTAL DISPLAY APPARATUS AND METHOD FOR PRODUCING THE SAME

RELATED APPLICATION

This application is related to commonly assigned U.S. application Ser. No. 08/695,632 filed Aug. 12, 1996, now abandoned.

BACKGROUND OF THE INVENTION

1. Field of the Invention

The present invention relates to a transmissive liquid crystal display apparatus with a wide viewing angle including a switching device such as a thin film transistor (hereinafter, referred to as a TFT).

2. Description of the Related Art

FIG. 9 is a circuit diagram showing a structure of a conventional transmissive liquid crystal display apparatus including an active matrix substrate.

Referring to FIG. 9, a plurality of pixel electrodes 1 are formed on the active matrix substrate in a matrix. TFTs 2 functioning as switching devices are connected to the pixel electrodes 1. Gate lines 3 (i.e., scanning lines for supplying scanning signals) are connected to gate electrodes of the TFTs 2. Gate signals input to the gate electrodes control so as to drive the TFTs 2. Source lines 4 (i.e., signal lines for supplying data signals) are connected to source electrodes of the TFTs 2, and data (display) signals are input to the pixel electrodes 1 via the TFTs 2 while the TFTs 2 are driven. The gate lines 3 and the source line 4 are running on the periphery of the pixels 1 arranged in a matrix and are orthogonally crossing each other. Furthermore, drain electrodes are connected to the pixel electrodes 1 and storage capacitors 5. Counter electrodes of the storage capacitors 5 are connected to common lines 6.

FIG. 10 is a cross-sectional view of the TFT portion of the active matrix substrate in the conventional liquid crystal display apparatus.

Referring to FIG. 10, the gate electrode 12 connected to the gate line 3 of FIG. 9 is formed on a transparent insulating substrate 11. A gate insulating film 13 is formed so as to cover the gate electrode 12. Furthermore, a semiconductor layer 14 is formed on the gate insulating film 13 so as to overlap the gate electrode 12. A channel protective layer 15 is formed in the central portion of the semiconductor layer 14. An n$^+$ Si layer to function as a source electrode 16a and a drain electrode 16b is formed so as to cover both end portions of the channel protective layer 15 and a part of the semiconductor layer 14 and to be divided by the channel protective layer 15. A metal layer 17a to function as a source line 4 of FIG. 9 is formed on one of the n$^+$ Si layers, i.e., the source electrode 16a, while a metal layer 17b for connecting the drain electrode 16b and the pixel 1 is formed on the other n$^+$ Si layer, i.e., the drain electrode 16b. Furthermore, an interlayer insulating film 18 is formed so as to cover the TFT 2, the gate line 3 and the source line 4.

A transparent conductive film to function as the pixel electrode 1 is formed on the interlayer insulating film 18. The transparent conductive film is connected to the metal layer 17b connected to the drain electrode 16b of the TFT 2 via a contact hole 19 penetrating the interlayer insulating film 18.

As described above, the interlayer insulating film 18 is formed between the gate line 3 and the source line 4 and the transparent conductive film to function as the pixel electrode 1. For this reason, the pixel electrode 1 can overlap the gate and source lines 3 and 4.

Conventionally, an inorganic film such as silicon nitride (SiN) of a thickness of about 500 nm is formed by a CVD method for the interlayer insulating film 18. Therefore, the pixel electrode 1 is generally formed with a step d of about 1 μm or more due to the underlying structure.

Furthermore, in such a conventional liquid crystal display apparatus, the maximum viewing angle is about ±50° to the right and left directions. As techniques for enlarging the viewing angle, a technique of dividing the pixel into multi-domains (pixel divisional alignment) or various other techniques are disclosed, for example in "Flat Panel Display, 1994" (pp.166) by Nikkei BP, Japanese Laid-Open Patent Publication No. 7-36043 or the like.

Furthermore, in recent years, a large TV screen has been developed. In addition, a wider screen (i.e., horizontally wide TV screen) has been increasingly the trend. In a liquid crystal TV set, a product with a wide screen has been researched and developed.

FIG. 11 is a view quantatively showing the relationship between a conventional TV screen 120 with the ratio of the shorter side to the longer side of 3:4 and a wide screen 121 with the ratio of the shorter side to the longer side of 9:16. In the case where a viewer views the wide screen 121 at an angle, in order for the viewer to view the screen end A on the side farther from the viewer, the screen is required to have a wider viewing angle $\theta_1$ than the viewing angle $\theta_2$ of the conventional TV screen 120 (i.e., $\theta_1 > \theta_2$). Herein, the viewing angle refers to a gradient angle with respect to the normal direction of the screen (i.e., substrate).

In the conventional liquid crystal display apparatus as described above, when the interlayer insulating film 18 is formed between the gate line 3 and source line 4 and the pixel electrode 1, the pixel electrode 1 can be formed so as to overlap the gate and source lines 3 and 4, thus improving an aperture ratio of the liquid crystal display apparatus and restricting unsatisfactory alignment of liquid crystal molecules. However, in the case where the pixel electrode 1 is overlapping the gate and source lines 3 and 4, a problem of an increase in capacitance between the gate and source lines 3 and 4 and the pixel electrode 1 is caused. In particular, an inorganic film such as silicon nitride film has a dielectric constant as high as 8, and is formed by a CVD method. As a result, the film has a thickness of about 500 nm. With such a thickness, the capacitance between the gate and source lines 3 and 4 and the pixel electrode 1 is increased, thus causing the following problems (1), (2) and (3). It is difficult to mass-produce an inorganic film such as silicon nitride film of a thickness of more than about 500 nm.

(1) In the case where the pixel electrode 1 overlaps the source line 4, the capacitance between the source line 4 and the pixel electrode 1 is increased, thereby raising a ratio of signal transmission. As a result, data signals stored in the pixel electrode 1 during a storage period are subjected to oscillation due to electric potentials of the data signals. Therefore, an effective voltage applied to the liquid crystal of the pixel fluctuates, so that vertical crosstalk in the vertical direction occurs, in particular, with respect to the adjacent pixel in the vertical direction in an actual display.

(2) In the case where the pixel electrode 1 overlaps the gate line 3 for driving the pixel, the capacitance between the gate line 3 and the pixel electrode 1 increases, thus increasing feed through of a voltage for writing in the pixel due to a switching signal for controlling the TFT 2.

(3) The dielectric constant of the interlayer insulating film 18 is as high as 8, and affected by the potential of the pixel electrode 1 or the counter electrode (not shown) formed on the counter substrate. In addition, the interlayer insulating film 18 is polarized by an electric field in the vicinity of the TFT in reliability tests such as light aging or the like. As a result, the switching characteristics of the TFT deteriorates, thus causing a problem in reliability such as unsatisfactory display.

Furthermore, in the vicinity of the step portion d, an alignment film (not shown) is not properly rubbed due to the surface state. Moreover, the interlayer insulating film 18 is relatively thin, and the dielectric constant is high. These two facts synergistically serve to generate a strong electric field, especially in the direction from the gate electrode 12 to the surface of the substrate so as to disturb a desired alignment of liquid crystal molecules on the periphery of the pixel.

Furthermore, in the vicinity of the contact hole 19, the alignment of the liquid crystal molecules is easily disturbed for a similar reason as described above resulted from the generation of a step. Therefore, a light-shielding film (not shown) for covering the unsatisfactory display portion is provided on the same substrate or the counter substrate (not shown). However, the provision of the light-shielding film lowers an aperture ratio, resulting in a dark screen. Thus, the viewing angle is limited because of the low aperture ratio and the provision of an unnecessary light-shielding film.

Furthermore, although the techniques such as a multi-domain system in order to improve the viewing angle are disclosed in the Publications described above or the like, they have the following problems:

1. Since the number of steps and the number of types of materials increases and the yield deteriorates, the cost increases.
2. Since delicate divisional alignment control is performed in micro regions, reliability is generally low.
3. Since light is dispersed due to divisional alignment or the like, luminance is lowered in a certain direction or the like, thus leading to a low contrast ratio. Namely, visibility deteriorates and the viewing angle is restricted.

As a result, the maximum viewing angle to the right and left directions is about 50° in the current mass production level or development level. Thus, a TFT liquid crystal display apparatus having a wide viewing angle and an excellent visibility and capable of being produced at a low cost has not been mass-produced yet.

Furthermore, as shown in FIG. 11, the wide screen type liquid crystal TV has a low visibility at the end of the screen, thus being unable to provide a satisfactory display to a large number of people in a large area.

SUMMARY OF THE INVENTION

A transmissive liquid crystal display apparatus according to the present invention includes a liquid crystal layer interposed between a first substrate and a second substrate. The first substrate includes gate lines, source lines and switching devices provided in the vicinity of inter-sectional portions of the gate lines and the source lines. The switching devices includes gate electrodes connected to the gate lines, source electrodes connected to the source lines and drain electrodes connected to pixel electrodes for applying a voltage to the liquid crystal layer. An interlayer insulating film having high transparency is provided above the switching devices, the gate lines and the source lines. The interlayer insulating film has roughness on its surface. The height difference of the roughness is 50 nm or less. The pixel electrodes are formed of a transparent conductive material and are provided on the interlayer insulating film.

In one embodiment of the invention, the thickness of the interlayer insulating film is in the range of about 1.5 μm to about 5 μm.

In another embodiment of the invention, the transmittance of light with a wavelength of about 400 nm to about 800 nm of the interlayer insulating film is about 90% or more.

In still another embodiment of the invention, the dielectric constant of the interlayer insulating film is in the range of about 2 to about 5.

In yet another embodiment of the invention, the transmissive liquid crystal display apparatus further includes interconnecting electrodes for connecting the pixel electrodes and the drain electrodes. The interlayer insulating film is provided above the switching devices, the gate lines, the source lines and the interconnecting electrodes. The pixel electrodes are provided in the interlayer insulating film so as to at least partially overlap at least either one of the gate lines and the source lines. The interconnecting electrodes and the pixel electrodes are connected to each other via contact holes penetrating the interlayer insulating film.

In yet another embodiment of the invention, the transmissive liquid crystal display apparatus further includes a single or multi-layered micro prism sheet on an opposite side to the liquid crystal layer of the first substrate or the second substrate.

In yet another embodiment of the invention, a line-like patterned light-shielding layer for defining the size of a pixel is provided on at least one of the first substrate and the second substrate, the light-shielding layer being provided so as not to extend beyond the gate lines and the source lines.

In yet another embodiment of the invention, the transmissive liquid crystal display apparatus further includes capacitor lines formed substantially parallel to the gate lines in central portions of the pixel electrodes. The contact holes are formed on the capacitor lines.

In yet another embodiment of the invention, the interconnecting electrodes are formed of a transparent conductive film.

In yet another embodiment of the invention, a metal nitride layer for connecting the interconnecting electrodes and the pixel electrodes are provided below the contact holes.

In yet another embodiment of the invention, the length of the contact hole in a lateral direction of the capacitor line does not exceed the width of the capacitor line by more than 2 μm.

In yet another embodiment of the invention, the transmissive liquid crystal display apparatus is a direct sight type. A ratio of a shorter side to a longer side is substantially 9:16.

According to another aspect of the invention, a method for producing a transmissive liquid crystal display apparatus includes the steps of: forming an interlayer insulating film having roughness of a height difference of about 50 nm or less on the first substrate including gate lines, source lines and switching devices provided in a vicinity of intersectional portions of the gate lines and the source lines. The switching devices include gate electrodes connected to the gate lines, source electrodes connected to the source lines and drain electrodes connected to pixel electrodes for applying a voltage to a liquid crystal layer. The method further includes the steps of applying a material of an initial viscosity of about 100 cps or less onto the switching devices, the gate lines and the source lines; and forming pixel electrodes formed of a transparent conductive material on the interlayer insulating film.

In one embodiment of the invention, the thickness of the interlayer insulating film is in a range of about 1.5 μm to 5 μm.

In another embodiment of the invention, the transmittance of light with a wavelength of about 400 nm to about 800 nm of the interlayer insulating film is about 90% or more.

In still another embodiment of the invention, the dielectric constant of the interlayer insulating film is in the range of about 2 to about 5.

In yet another embodiment of the invention, the first substrate further includes interconnecting electrodes for connecting the pixel electrodes and the drain electrodes. The interlayer insulating film forming step is a step of forming the interlayer insulating film above the switching devices, the gate lines, the source lines and the interconnecting electrodes. The method further includes the step of forming contact holes penetrating the interlayer insulating film. The pixel electrode forming step is a step wherein the pixel electrodes are provided in the interlayer insulating film so as to at least partially overlap at least either the gate lines or the source lines, and the interconnection electrodes and the pixel electrodes are electrically connected to each other via the contact holes.

In yet another embodiment of the invention, the interlayer insulating film is formed of a photosensitive material and is patterned by exposure and alkali development.

In yet another embodiment of the invention, the step of applying the material formed into the interlayer insulating film is performed by a spin coating method, a roll coating method or a slot coating method.

In yet another embodiment of the invention, the rotation rate in the spin coating method is in a range of about 800 rpm to about 1500 rpm.

Thus, the invention described herein makes possible the advantages of (1) providing a transmissive liquid crystal display apparatus having a wide viewing angle and an excellent visibility and is capable of being produced at a low cost and a method for producing the same and (2) providing a wide screen type transmissive liquid crystal display apparatus capable of easily effecting a satisfactory display to a large number of people in a large area.

These and other advantages of the present invention will become apparent to those skilled in the art upon reading and understanding the following detailed description with reference to the accompanying figures.

DESCRIPTION OF THE PREFERRED EMBODIMENTS

Figure 1:
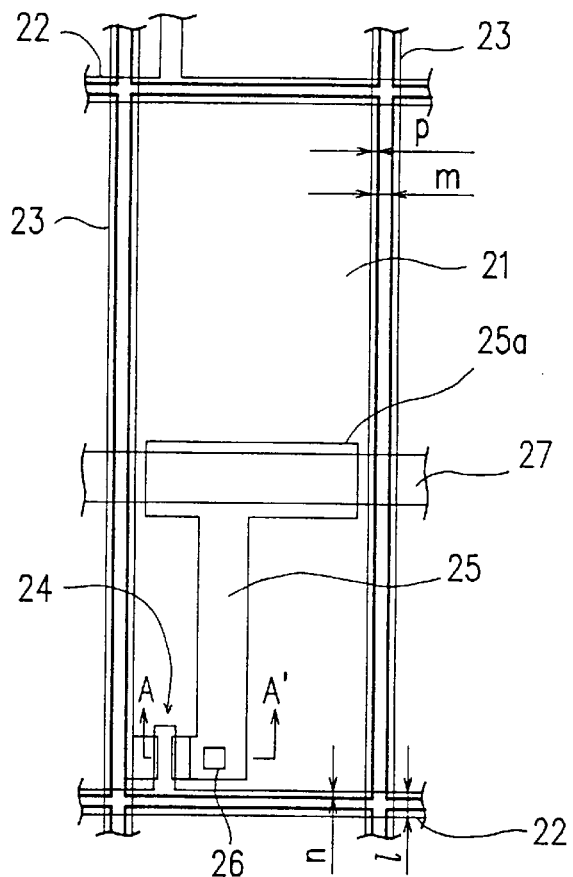
FIG. 1 is a plan view illustrating a structure of one pixel portion of an active matrix substrate of a transmissive liquid crystal display apparatus of Example 1 according to the present invention.

According to the present invention, an interlayer insulating film is provided so as to cover a switching device, a scanning line and a signal line. A pixel electrode formed thereon is connected to the corresponding electrodes of a TFT directly from a contact hole penetrating the interlayer insulating film or via an interconnecting electrode. Thus, by providing the interlayer insulating film, the pixel electrode can overlap the scanning line and the signal line, thereby raising an aperture ratio (e.g., to about 78% or more).

In this case, when a height difference of roughness (e.g., waviness or steps) on the surface of the interlayer insulating film is about 50 nm or less, a liquid crystal display apparatus having a wide viewing angle and high luminance can be obtained. Preferably, a thickness of the interlayer insulating film is in the range of about 1.5 $\mu$m to about 5 $\mu$m. Furthermore, a dielectric constant of the interlayer insulating film is preferably in the range of about 2 to about 5. Furthermore, a transmittance of light with a wavelength of about 400 nm to about 800 nm of the interlayer insulating film is preferably about 90% or more. As a result of experiments, it was found that when the interlayer insulating film which satisfies all of the above-mentioned conditions was used, the maximum viewing angle to the right and left directions was about 70°, which is significantly larger than that of the conventional liquid crystal display apparatus.

Furthermore, in the case where the roughness (waviness or steps) on the surface of the interlayer insulating film is about 50 nm or less, a rubbing treatment is unlikely to be impaired, thus minimizing disturbance of a desired alignment of liquid crystal molecules. Thus, it is possible to reduce or eliminate a light-shielding layer provided on a specific portion in the vicinity of the lines, resulting in a low cost and an improved aperture ratio.

Furthermore, the interlayer insulating film has a relatively large thickness in the range of about 1.5 $\mu$m to about 5 $\mu$m, the pixel electrode is formed so as to overlap the lines in its peripheral portion, and the dielectric constant of the interlayer insulating film is small. Thus, the electric field from the lines is perpendicular to the substrate, and the absolute value of the electric field is small, resulting in uniform alignment. Therefore, the luminance of the liquid crystal display apparatus (amount of transmitted light) is increased, and the reduction or elimination of the light-shielding layer is possible, thus improving the aperture ratio. As described above, when the aperture ratio is increased, a ratio of the surface area of the light-shielding layer is reduced, and reflected light of unnecessary external light or the like is reduced, thereby improving visibility, contrast and the like. Furthermore, since the dielectric constant of the interlayer insulating film is as low as about 2 to about 5, polarization is unlikely to occur, thus resulting in high reliability.

Furthermore, since the interlayer insulating film having a transmittance of light with a wavelength in the range of about 400 nm to about 800 nm of about 90% or more is used, the high luminance is maintained.

In order to form the interlayer insulating film of a thickness in the range of about 1.5 µm to about 5 µm, it is preferable to use a coating method such as a spin coating method, a roll coating method or a slot coating method rather than a conventional CVD method. Such a coating method makes it possible to easily improve mass-productivity and reduce production cost. Furthermore, in the case where a coating method is used, when convexities and concavities exist in the underlying structure of the interlayer insulating film, roughness (waviness or steps) is formed on the surface of the interlayer insulating film formed on the structure. However, by using a material having an initial viscosity of about 100 cps or less for forming the interlayer insulating film, a difference between the highest point and the lowest point of the waviness or a height of the step can be about 50 nm or less. Furthermore, when a photosensitive material is used, processes such as application and removal of a resist can be simplified, thus making it possible to further reduce the production cost. The formation of the interlayer insulating film of about 1.5 µm or more can make it possible to reduce leakage and improve reliability and production yield, leading to a lower production cost.

Figure 12:
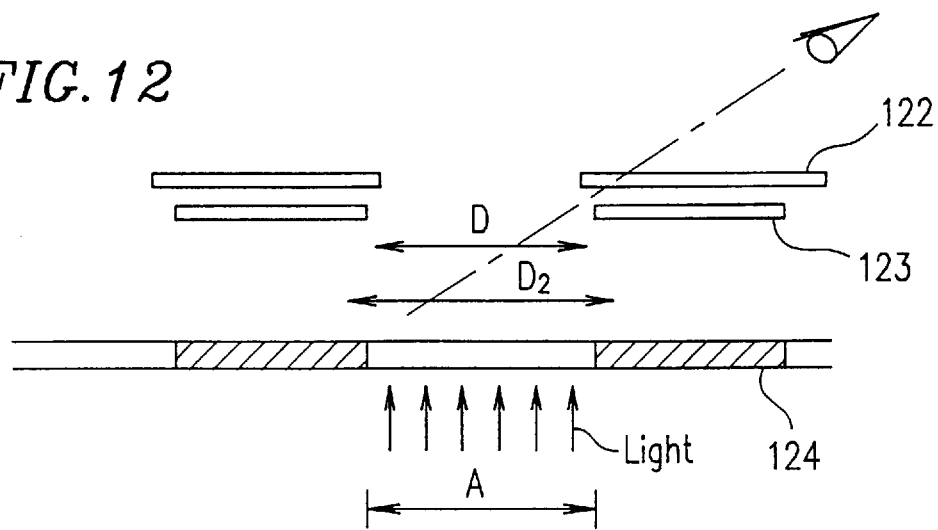
FIG. 12 is a view illustrating the reason why an effect of a wider viewing angle is increased in the case where a light-shielding film is provided.

Furthermore, the light-shielding layer is not extended beyond the lines so that unnecessary light reflected by the light-shielding layer is reduced as described above, and the amount of transmitted light is increased. In addition, the viewing angle is enlarged. The reason will be described in detail with reference to FIG. 12. Herein, it is assumed that a wider light-shielding layer 122 and a narrower light-shielding layer 123 are formed above the line 124 at the same height. When viewed from a direction with a certain angle, a transmissive face (having a width A) cannot be visible in the case of the wider light-shielding layer 122, while the transmissive face can be visible in the case of the narrower light-shielding layer 123. FIG. 12 is a simplified view, and in reality light is repeatedly refracted and reflected so that a precise explanation cannot be made simply by using the case of straight sight, but the same as described above is believed to be true herein.

The refractive index of the interlayer insulating film preferably has a smallest possible difference from the refractive index of the substrate or the liquid crystal layer. Specifically, the refractive index of the interlayer insulating film is preferably in the range of about 1.3 to about 1.7, more preferabley in the range of about 1.5 to about 1.6. When the difference in refractive indices of the interlayer insulating film and of the substrate or the liquid crystal layer is excessively large, the reflectance at the interfaces therebetween is severely large and thus reduces the brightness of the display.

Furthermore, when the peripheral portion of the pixel electrode is overlapped with a part of the lines, the aperture ratio can be enlarged to the maximum, and the electric field applied to a liquid crystal material can be made uniform, thereby making it possible to control the liquid crystal molecules to be uniformly aligned and increase the amount of transmitted light. Moreover, low precision in processing the pixel electrode with respect to the lines does not cause a serious problem, thus leaked light can be shielded by the lines.

As described above, the liquid crystal display apparatus having an aperture ratio of about 78% or more is capable of increasing a contrast ratio because of the improvement in luminance by the improvement in the aperture ratio, the reduction of reflected light or the like. The higher contrast ratio leads to the enlargement of the viewing angle. Namely, a wide viewing angle is possible. In this case, in addition to the effect of a larger aperture ratio, a configurative factor shown in FIG. 12 synergistically improves the viewing angle.

According to the present invention, basically, a conventional liquid crystal display apparatus with an interlayer insulating film formed of silicon nitride is changed in terms of the production process and the material of the interlayer insulating film. Moreover, various sizes and design rules are optimized. As a result, a liquid crystal display apparatus produced at a low cost and having high reliability and a wide viewing angle, which has not been attained by the prior art, can be realized. For example, the aperture ratio of the conventional 10.4 inch VGA liquid crystal display apparatus having a viewing angle to the right and left directions of about 40° can be improved from about 65% to about 85%. Those of 10.4 inch SVGA, 11.3 inch SVGA, 12.1 inch SVGA and 12.1 inch XGA liquid crystal display apparatuses can be improved from about 60% to about 81%, about 62% to about 82%, about 62% to about 82% and about 55% to about 78%, respectively. Thus, it is possible to brighten the liquid crystal display apparatuses. Furthermore, it is possible to enlarge the conventional viewing angles to the right and left directions of 40° by about 10° to about 30°.

Furthermore, a single or multi-layered micro prism sheet is inserted between the back of such a liquid crystal display apparatus, i.e., a backlight source, and the substrate closer thereto so that the viewing angle is further enlarged. More specifically, in the 10.4 inch VGA type liquid crystal display apparatus, generally, visibility can be obtained even when viewed from the sides of the screen (i.e., the viewing angle to the right and left directions of about ±90°). Accordingly, an epoch-making liquid crystal display apparatus similar to a CRT which has no limitation in the right and left viewing angle can be obtained.

Furthermore, a direct sight type wide screen TV of the ratio of the shorter side to the longer side of about 9:16 has visibility as high as a CRT or higher by using such a transmissive liquid crystal display apparatus, thereby it can be a light, thin and compact TV imaging product. Accordingly, the demand for such a TV imaging product will increasingly grow.

Furthermore, according to the present invention, storage capacitor lines are formed in the vicinity of the central portion of the pixel electrodes substantially parallel to the scanning lines, and contact holes are formed on the storage capacitor lines so as to penetrate the interlayer insulating films. Thus, since the scanning lines and the storage capacitor lines are covered by the pixel electrodes via the interlayer insulating films, the alignment of liquid crystal molecules is not disturbed by the electric field from the scanning lines and the storage capacitor lines, resulting in a high contrast ratio.

Moreover, the storage capacitor lines can shield leaked light caused by the disturbance of the liquid crystal molecules which occurs in the contact hole portion, resulting in a high contrast ratio. At this time, when a smooth contact hole is formed, breaks due to steps of the pixel electrodes are reduced, thus making a high production yield and a low cost possible.

When an interconnecting electrode for connecting the other electrodes of the TFT and the pixel electrode is formed of a transparent conductive film, the aperture ratio is further improved.

Furthermore, when a metal nitride layer is formed below the contact hole penetrating the interlayer insulating film, adhesion between the interlayer insulating film and the underlying film is increased.

Furthermore, when a large contact hole is formed, as long as an extended length of the contact hole beyond the storage capacitor line is about 2 μm or less in the lateral direction, light leakage can be less outstanding. Furthermore, patterning is performed by exposure and alkali development as described below, so that a further smooth contact hole can be formed. In addition, by forming a large contact hole, the contact hole becomes more smooth.

Furthermore, according to a method for producing the transmissive liquid crystal display apparatus of the present invention, a product having a wide viewing angle as described above can be realized. In addition, an interlayer insulating film is formed by a coating method such as a spin coating method or a roll coating method. Accordingly, the production process can be simplified, thereby making it possible to improve production yield and reduce production cost. Furthermore, the maximum acceptable value within which a first substrate and a second substrate can be dislocated when they are attached is about 5 μm. Therefore, the liquid crystal display apparatus can be easily produced by the current production techniques. Furthermore, when the first substrate and the second substrate are attached in a more accurate manner with a smaller amount of dislocation, a liquid crystal display apparatus having a higher aperture ratio can be designed and mass-produced. As described above, when the material has an initial viscosity of about 100 cps or less, an insulating film having a smooth surface with roughness (waviness or steps) of a height of about 50 nm or less can be formed.

Furthermore, when the interlayer insulating film is photosensitive, it is possible to simplify steps such as application and removal of a resist, thereby improving production yield and reducing production cost.

In the case where a spin coating method is used as the coating method, when spinning is performed between about 800 rpm and about 1500 rpm, an interlayer insulating film having a smooth surface can be stably produced at high speed.

Figure 13A:
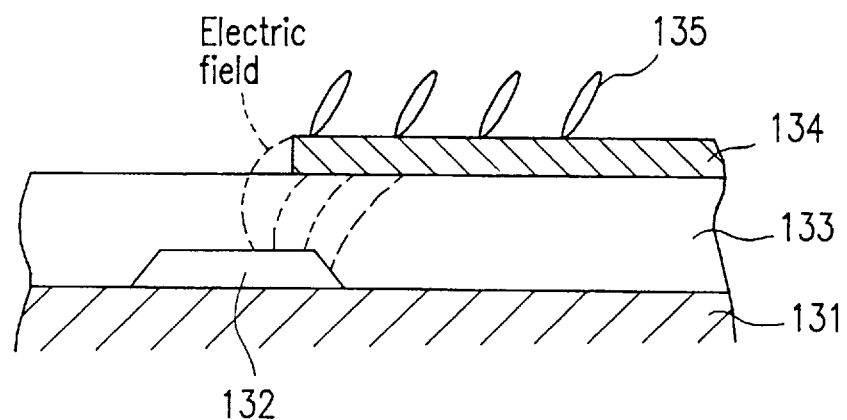
FIGS. 13A and 13B are views illustrating the reason why the generation of disclination is prevented in the transmissive liquid crystal display apparatus of the present invention.
Figure 13B:
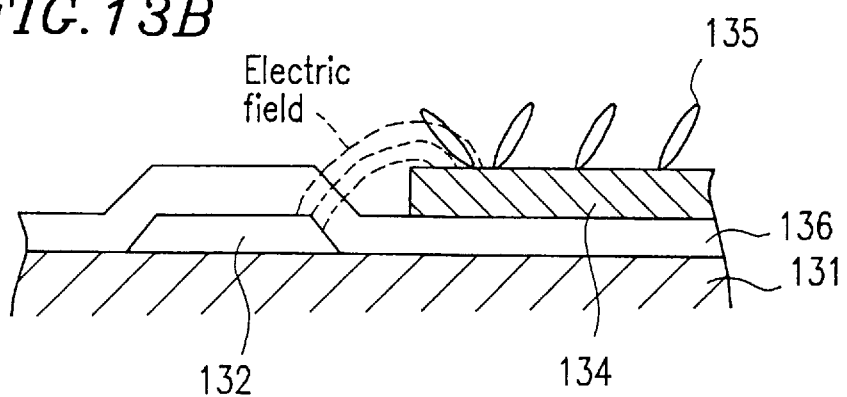

Furthermore, according to the present invention, as shown in FIG. 13A, an end portion of a pixel electrode 134 formed on an interlayer insulating film 133 exists above the gate line 132 (and the source line) formed on a substrate 131. In a conventional example where a gate line 132 formed on a substrate 131 is covered only by a relatively thin gate insulating film 136, as shown in FIG. 13B, a pixel electrode 134 is formed in such a manner that a portion of the pixel electrode 134 does not overlap the gate line 132 (and the source line). As a result, in the conventional example, the electric field generated between the gate line 132 (and the source line) and the end portion of the pixel electrode 134 affects the liquid crystal molecules 135 located in the end portion of the pixel electrode 134 so that the liquid crystal molecules therein incline in a different direction from other liquid crystal molecules so as to generate disclination lines. However, according to the present invention with the structure as described above, since the liquid crystal molecules are aligned substantially in the same direction, the generation of the disclination lines can be prevented.

Hereinafter, the present invention will be described by way of examples with reference to the accompanying drawings.

EXAMPLE 1

FIG. 1 is a plan view illustrating a structure of one pixel portion of an active matrix substrate of a transmissive liquid crystal display apparatus of Example 1 according to the present invention.

Referring to FIG. 1, a plurality of pixel electrodes 21 (indicated by a bold line) are formed on an active matrix substrate in a matrix. Gate lines 22 as scanning lines supplying scanning signals and source lines 23 as signal lines supplying data signals are provided on the periphery of the pixel electrodes 21 so as to orthogonally cross each other. The gate lines 22 and the source lines 23 partially overlap the peripheral portions of the pixel electrodes 21. TFTs 24 functioning as switching devices connected to the pixel electrodes 21 are provided in the intersectional portions of the gate lines 22 and the source lines 23. The gate lines 22 are connected to gate electrodes of the TFTs 24, and the TFTs 24 are driven and controlled by signals input to the gate electrodes. The source lines 23 are connected to source electrodes of the TFTs 24, and data signals are input to the source electrodes of the TFTs 24. Furthermore, drain electrodes of the TFTs 24 are connected to the pixel electrodes 21 via interconnecting electrodes 25 and contact holes 26, and connected to electrodes 25a of storage capacitors (hereinafter, referred to as storage capacitor electrodes 25a) via the interconnecting electrodes 25. The other electrodes 27 of the storage capacitors (hereinafter, referred to as storage capacitor counter electrodes 27) are connected to common lines.

Figure 2:
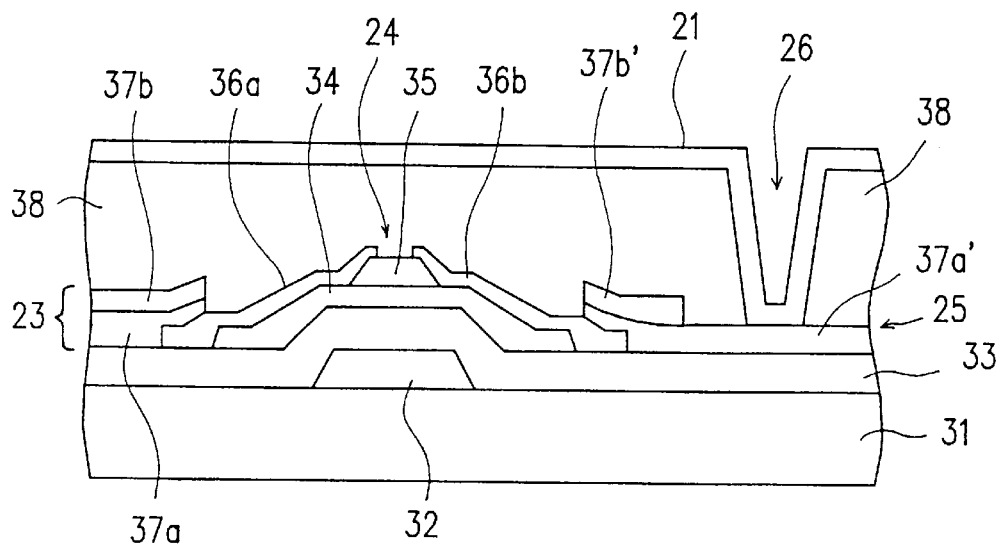
FIG. 2 is a cross-sectional view taken at line A–A' of the active matrix substrate of the transmissive liquid crystal display apparatus of FIG. 1.

FIG. 2 is a cross-sectional view taken at line A–A' of the active matrix substrate of the transmissive liquid crystal display apparatus of FIG. 1.

Referring to FIG. 2, the gate electrode 32 connected to the gate line 22 of FIG. 1 is formed on a transparent insulating substrate 31. A gate insulating film 33 is formed so as to cover the gate electrode 32. Furthermore, a semiconductor layer 34 is formed on the gate insulating film 33 so as to overlap the gate electrode 32. A channel protective layer 35 is formed in the central portion of the semiconductor layer 34. An n$^+$ Si layer to function as a source electrode 36a and a drain electrode 36b is formed so as to cover both end portions of the channel protective layer 35 and a part of the semiconductor layer 34 and to be divided by the channel protective layer 35. A transparent conductive film 37a and a metal layer 37b are formed in the end portion of the source electrode 36a, i.e., one of the n$^+$ Si layer so as to form a two layered source line 23. A transparent conductive film 37a' and a metal layer 37b' are formed in the end portion of the drain electrode 36b, i.e., the other n$^+$ Si layer. The transparent conductive film 37a' is extended to connect the drain electrode 36b and the pixel electrode 21 and to function as the interconnecting electrode 25 connected to the storage capacitor electrodes 25a. Furthermore, an interlayer insulating film 38 is formed so as to cover the TFT 24, the gate line 22 and the source line 23, and the interconnecting electrode 25. The channel protective film 35 can be simplified depending on the production process. The interlayer insulating film may be formed of an acrylic type or fluorine type resin, TEOS (Tetra Ethyl Ortho Silicate; refer to FIG. 5 on page 56, July 1994, Nikkei Micro Device) or an inorganic material. Moreover, the interlayer insulating film can be a single layer or a multi layer formed of the same material or different materials.

A transparent conductive film to function as the pixel electrode 21 is formed on the interlayer insulating film 38. The transparent conductive film is connected to the drain electrode 36b of the TFT 24 by the transparent conductive film 37a' functioning as the interconnecting electrode 25 via a contact hole 26 penetrating the interlayer insulating film 38.

The active matrix substrate of Example 1 is constructed as described above and produced as follows:

First, a gate electrode 32, a gate insulating film 33, a semiconductor layer 34, a channel protective layer 35, an n$^+$ Si layer to function as a source electrode 36a and a drain electrode 36b are sequentially deposited on a transparent insulating substrate 31 formed of a glass, a resin or the like. The production process so far is the same as the method for producing a conventional active matrix substrate.

Next, transparent conductive films 37a and 37a' to function as the source line 23 and the interconnecting electrode 25 and metal layers 37b and 37b' are sequentially deposited by sputtering to be patterned into desired patterns.

Furthermore, for example, a photosensitive acrylic resin is formed into the interlayer insulating film 38 by a spin coating method so that an initial thickness thereof is about 4.5 μm and a thickness after curing is about 3 μm. The resin is exposed to light in accordance with a desired pattern and treated with an alkali solution. As a result, the resin in the exposed portion is etched by the alkali solution, thereby forming a contact hole 26 which penetrates the interlayer insulating film 38.

After the formation of the interlayer insulating film 38, the surface portion of the interlayer insulating film 38 with a thickness of about 100 nm to about 200 nm may be ashed in an oxygen plasma atmosphere using a dry etching apparatus in order to improve the adhesion between the interlayer insulating film 38 and a transparent conductive film formed thereon. The roughness of the resultant surface of the interlayer insulating film 38 may be about 50 nm or less.

Thereafter, a transparent conductive film to function as the pixel electrode 21 is formed by sputtering and patterned. Thus, the pixel electrode 21 is connected to the transparent conductive film 37a' connected to the drain electrode 36b of the TFT 24 via the contact hole 26 penetrating the interlayer insulating film 38. In this manner, the active matrix substrate of Example 1 can be produced.

In the thus produced active matrix substrate, the interlayer insulating film 38 is formed between the gate line 22 and source line 23 and the pixel electrode 21. As a result, the pixel electrode 21 can overlap both of the gate line 22 and source line 23. For this reason, when the thus produced active matrix substrate is employed in a transmissive liquid crystal display apparatus including liquid crystal between the active matrix substrate and the counter substrate, the aperture ratio can be improved. Moreover, since the electric field caused by both of the gate lines 22 and source lines 23 is shielded by the pixel electrode 21, unsatisfactory alignment of liquid crystal molecules can be suppressed.

Furthermore, when the interlayer insulating film 38 is formed of an acrylic type resin, the dielectric constant thereof is about 3.0. When the interlayer insulating film 38 is formed of SiO$_2$, the dielectric constant thereof is about 4.0. These dielectric constants are lower than the dielectric constant of 8 of the interlayer insulating film formed of silicon nitride. In addition, the interlayer insulating film formed of an acrylic type resin or SiO$_2$ has high transparency and can be easily formed in a thickness of 3 μm by a spin coating method. For this reason, it is possible to reduce the capacitance between the gate line 22 and the pixel electrode 21 and between the source line 23 and the pixel electrode 21, thereby making it difficult for signals to pass the capacitor, namely, reducing a ratio of signal transmission. As a result, an adverse effect such as crosstalk in the display caused by the capacitance between the gate and source lines 22 and 23 and the pixel electrode 21 can be further reduced, resulting in a satisfactory and bright display. Furthermore, by performing patterning by exposure and alkali development, the tapered shape of the contact hole 26 can be more satisfactory and smoother, resulting in a satisfactory connection between the pixel electrode 21 and the transparent conductive film 37a' functioning as the interconnecting electrode 25. Furthermore, by using a photosensitive acrylic resin, a coating method such as a spin coating method or a roll coating method can be used to form a thin film. Therefore, a thin film of a thickness of several μm can be easily formed, and a photoresist process is unnecessary for patterning. As a result, the use of a photosensitive acrylic resin provides an advantage in productivity. Herein, the acrylic type resin used as the interlayer insulating film 38 has been colored before being coated. However, the acrylic type resin can be made transparent by an exposure treatment of the entire resin after patterning. Thus, the treatment for making the resin transparent can be not only optically performed but also chemically performed.

It is preferable to use a positive-type photosensitive acrylic resin, which is a photosensitive transparent acrylic resin with high transparency which dissolves in a developing solution after exposure to light. For example, the positive-type photosensitive acrylic resin is preferably a material composed of a copolymer of methacrylic acid and glycidyl methacrylate as a base polymer mixed with a naphthoquinone diazide positive-type photosensitive agent, for example. Since this resin contains the glycidyl group, it can be crosslinked (cured) by heating. After curing, the resin has the properties of: a dielectric constant of about 3.4; and a transmittance of 90% or more for light with a wavelength in the range of 400 to 800 nm. The resin can be decolored in a shorter time by being irradiated with i-line (365 nm) ultraviolet light. Ultraviolet light other than the i line can be used for patterning. Since the heat resistance of the photosensitive acrylic resin used in this example is generally 280° C., the degradation of the interlayer insulating film can be suppressed by conducting the process such as the formation of the pixel electrodes after the formation of the interlayer insulating film at a temperature in the range of about 250° C. to 280° C. The refractive index of the interlayer insulating film used in this example is about 1.55.

Furthermore, the formation of the transparent conductive film 37a' as the interconnecting electrode 25 for connecting the drain electrode 36b of the TFT 24 and the pixel electrode 21 provides the following advantages: In a conventional active matrix substrate, since the interconnecting electrode is formed of a metal layer, when the interconnecting electrode exists in an opening portion, an aperture ratio is lowered. In order to prevent the deterioration of the aperture ratio, conventionally, the interconnecting electrode is formed on the TFT or the drain electrode of the TFT, and the contact hole of the interlayer insulating film is formed thereon so as to connect the drain electrode of the TFT and the pixel electrode. However, according to the conventional method, in particular, in the case where the TFT is miniaturized in order to improve the aperture ratio, the contact hole cannot be provided completely on the TFT, leading to the deterioration of the aperture ratio. In addition, in the case where an interlayer insulating film as thick as several μm is formed, in order for the pixel electrode to contact the underlying interconnecting electrode, it is necessary to form the contact hole into a tapered shape. Thus, it is necessary to take an even larger area for the interconnecting electrode on the TFT. For example, in the case where the diameter of the contact hole is 5 μm, in view of the tapered region of the contact hole and alignment accuracy, a size of the interconnecting electrode of about 14 μm is required. When a TFT of a size less than 14 μm is formed on the conventional active matrix substrate, an aperture ratio deteriorates due to the interconnecting electrode. On the other hand, on the active matrix substrate of Example 1, since the interconnecting electrode 25 is formed of the transparent conductive film 37a', the aperture ratio does not deteriorate. Furthermore, the interconnecting electrode 25 is extended so as to connect the drain electrode 36b of the TFT and the storage capacitor electrode 25a formed of the transparent conductive film 37a', thus the extended portion is also formed of the transparent conductive film 37a'. Thus, the aperture ratio does not deteriorate due to the gate and source lines.

Furthermore, when the source line 23 is formed into a two layered structure, even if defects in a film of a part of the metal layer 37b constituting the source line 23 exist, since the transparent conductive film 37a formed of ITO or the like makes electrical connection possible, breaks in the source line 23 can be advantageously reduced.

EXAMPLE 2

In Example 2, another process for forming the interlayer insulating film 38 will be described.

First, an organic thin film which is not photosensitive is formed by a spin coating method. A photoresist is formed thereon and patterned, and then it is subjected to an etching treatment so as to form a contact hole 26 penetrating the interlayer insulating film 38 and so as to perform patterning of the interlayer insulating film 38.

Alternatively, an insulating film which is not photosensitive is deposited and a photoresist is formed thereon and patterned, and then subjected to an etching treatment so as to perform patterning of the interlayer insulating film 38.

Using the active matrix substrate on which the interlayer insulating film 38 is formed in this manner, a transmissive liquid crystal display apparatus of a high aperture ratio can be realized.

Furthermore, in the case where an organic thin film which is not photosensitive is used as the interlayer insulating film 38, since the organic thin film has a low dielectric constant and high transparency, a film as thick as 3 μm can be obtained. Therefore, the capacitance between the gate line 22 and the pixel electrode 21 and the capacitance between the source line 23 and the pixel electrode 21 can be reduced by the low dielectric constant and the extended distance between the storage capacitor electrode 25a and the storage capacitor counter electrode 27.

Examples of the non-photosensitive organic thin film include a thermally curable acrylic resin. More specifically, JSS-924 (2-component system acrylic resin) and JSS-925 (1-component system acrylic resin) manufactured by Japan Synthetic Rubber Co., Ltd. can be used. These resins generally have a heat resistance of 280° C. or more. Using a non-photosensitive resin for the interlayer insulating film allows for freer resin design. For example, polyimide resin can be used. Examples of transparent and colorless polyimide resin include polyimides obtained by the combination of acid anhydrides such as 2,2-bis(dicarboxyphenyl) hexafluoropropylene acid anhydride, oxydiphthalic acid anhydride, and biphenyl tetracaboxylic acid anhydride, with meta-substituted aromatic diamines having a sulfone group and/or an ether group or diamines having a hexafluoropropylene group. These polyimide resins are disclosed in Fujita, et al., Nitto Giho, Vol. 29, No. 1, pp. 20–28 (1991), for example. Among the above transparent and colorless polyimide resins, a resin containing both acid anhydride and diamine each having a hexafluoropropylene group has a high transparency. Fluoric resins other than the above fluoric polyimides can also be used. Fluoric materials have not only excellent colorless transparency but also a low dielectric constant and high heat resistance.

EXAMPLE 3

Figure 3:
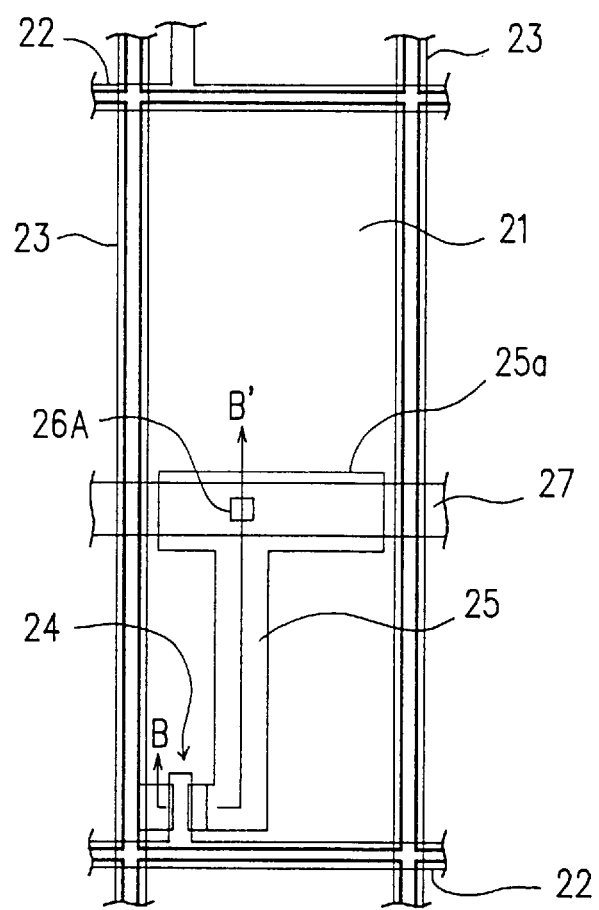
FIG. 3 is a plan view illustrating a structure of one pixel portion of an active matrix substrate of a transmissive liquid crystal display apparatus of Example 3 according to the present invention.
Figure 4:
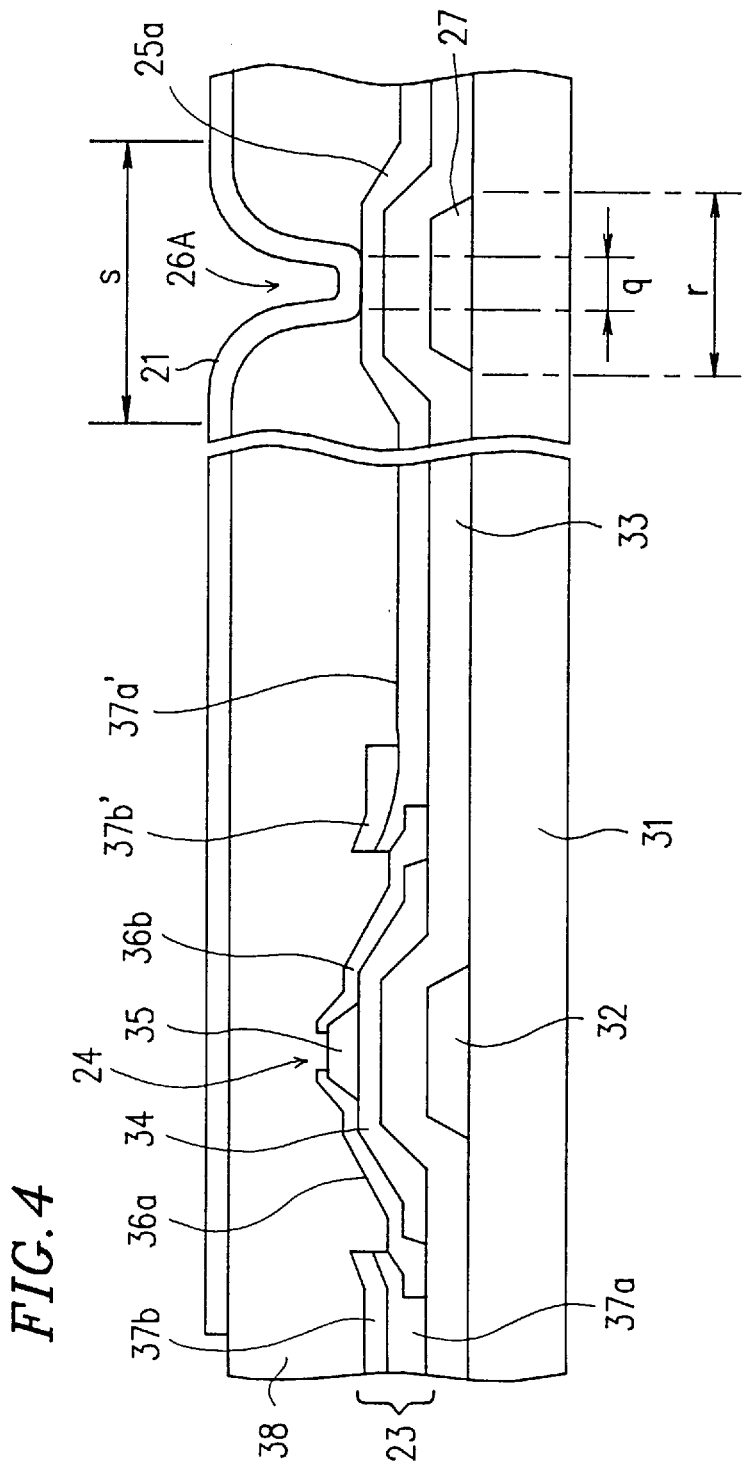
FIG. 4 is a cross-sectional view taken at line B–B' of the active matrix substrate of the transmissive liquid crystal display apparatus of FIG. 3.

FIG. 3 is a plan view illustrating a structure of one pixel portion of an active matrix substrate of a transmissive liquid crystal display apparatus of Example 3 according to the present invention. FIG. 4 is a cross-sectional view taken at line B–B' of the active matrix substrate of the transmissive liquid crystal display apparatus of FIG. 3. The components having the same functions as those shown in FIGS. 1 and 2 bear the same reference numerals and the description thereof is omitted.

Figure 9:
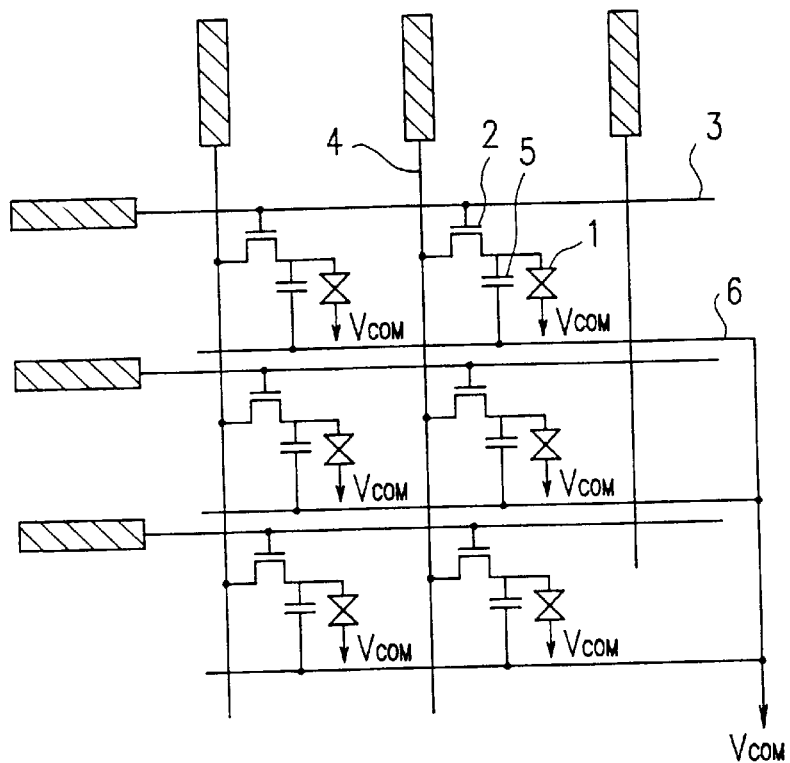
FIG. 9 is a circuit diagram illustrating a structure of a conventional liquid crystal display apparatus including an active matrix substrate.
Figure 10:
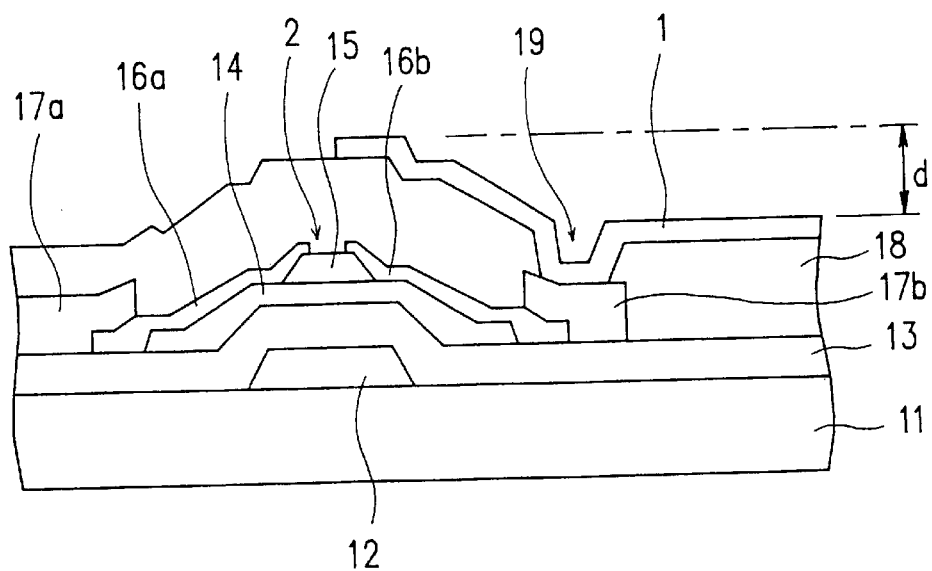
FIG. 10 is a cross-sectional view of a TFT portion of the active matrix substrate of the conventional liquid crystal display apparatus.
Figure 11:
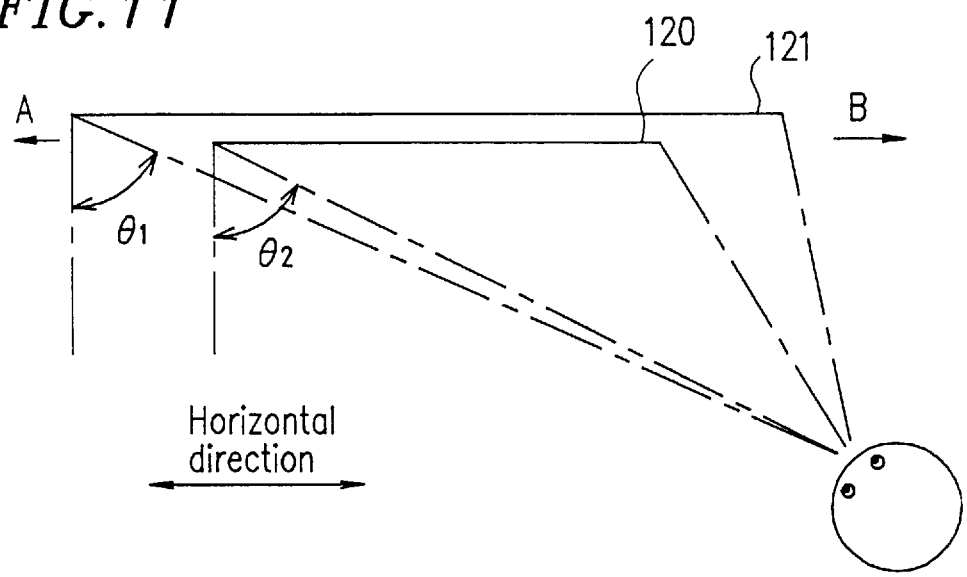
FIG. 11 is a view illustrating a difference in visibility between a conventional liquid crystal TV and a wide screen type liquid crystal TV.

In the active matrix substrate of Example 3, the storage capacitor electrodes 25a of the pixels located in the end portions of the interconnecting electrodes 25 connected to the drain electrodes 36b of the TFT 24 are opposed to the storage capacitor counter electrodes 27. The storage capacitor counter electrodes 27 are connected to counter electrodes formed on a counter substrate via the storage capacitor common lines 6 of FIG. 9. A contact hole 26A to penetrate the interlayer insulating film 38 is formed above the storage capacitor counter electrode 27 in one end of the storage capacitor common line 6 and the storage capacitor electrodes 25a. Namely, the contact hole 26A is provided above the storage capacitor lines formed of light-shielding metal films.

The active matrix substrate of Example 3 provides the following advantages:

For example, when the thickness of the interlayer insulating film 38 is about 3 μm, which thickness cannot be ignored when compared with the thickness of about 4.5 μm of the liquid crystal cell, light leakage occurs on the periphery of the contact holes 26A due to disturbance of alignment of liquid crystal molecules. Therefore, in the case where such contact holes 26A are formed in opening portions of a transmissive liquid crystal display apparatus, contrast deteriorates due to the light leakage. On the other hand, in the active matrix substrate of Example 3, the contact holes 26A are formed above the light-shielding metal film of the storage capacitor counter electrodes 27 in one end of the storage capacitor common lines 6 and the storage capacitor electrodes 25a. Thus, contrast does not deteriorate. More specifically, when the contact holes 26A are provided above the storage capacitor lines formed of the light-shielding metal film, even if light leakage occurs due to disturbance of alignment of liquid crystal molecules, light leakage occurs in the light-shielding portion other than opening portions. Thus, the deterioration of contrast does not occur. This is true when a storage capacitor electrode is formed of a part of an adjacent gate line 22. In this case, the contact holes 26A are formed on the adjacent gate lines 22 so that the gate lines 22 shield light so as to prevent the deterioration of contrast.

Furthermore, in the active matrix substrate of Example 3, the transparent conductive film 37a' is formed as the interconnecting electrodes 25 for connecting the drain electrodes 36b of the TFTs 24 and the contact holes 26A. Therefore, even if the contact holes 26A are formed on the storage capacitors, the aperture ratio does not deteriorate.

Design rules of a 10.4 inch VGA liquid crystal display apparatus developed according to this example will be described below.

A width (1) of the gate line 22 is set at 10 μm; a second substrate (not shown) opposed to the substrate 31 is not provided with a light-shielding film; a width (m) of the source line 23 is set at 7 μm; a light-shielding film (not shown) of a design width of 6 μm is provided on the second substrate opposed to the substrate 31 with respect to the source lines 23. The light-shielding film is formed of a resin material so as to obtain a less reflective light-shielding film.

Figure 5:
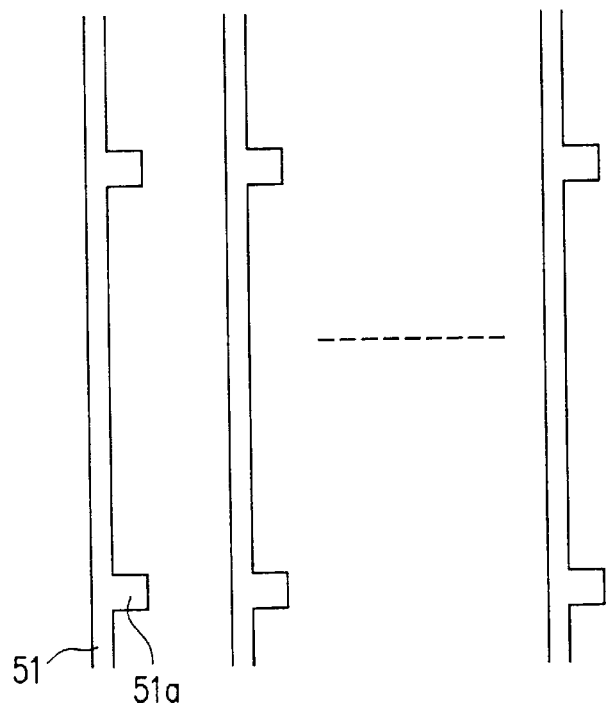
FIG. 5 is a plan view illustrating a light-shielding film used in a liquid crystal display apparatus as a result of the development based on Example 3.
Figure 6:
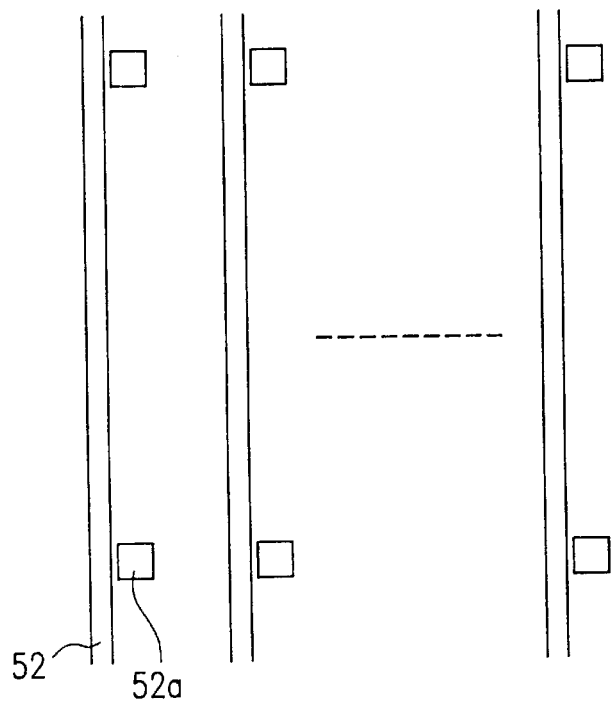
FIG. 6 is a plan view illustrating another light-shielding film used in a liquid crystal display apparatus as a result of the development based on Example 3.

FIGS. 5 and 6 show patterns of light-shielding films 51 and 52. Projections 51a and 52a are provided in portions corresponding to the TFTs 24, respectively. There was no light-shielding pattern of a liquid crystal display apparatus of this type in the past.

Display quality was tested under the following conditions: a pixel pitch is set as 110 μm×330 μm; and (1) n and p are both about 1.5 μm; (2) n and p are both about 2 μm; or (3) n and p are different values of about 1.5 μm and about 2 μm (wherein n is the size of the overlap of the pixel electrodes 21 and the gate lines 22, and p is the size of the overlap of the pixel electrodes 21 and the source lines 23). Display quality was satisfactory in all of the above cases. An acceptable average value of dislocation when the first substrate 31 and the second substrate (not shown) are attached in mass production is about 5 μm.

A contact width (q) of the contact hole 26A is about 5 μm. The contact hole 26A is patterned in such a manner that a width (r) of the storage capacitor counter electrode 27 is about 16 μm and an outer width (s) of the contact hole 26A is about 12 μm to about 18 μm so as to obtain a smooth cross-sectional shape.

Figure 7:
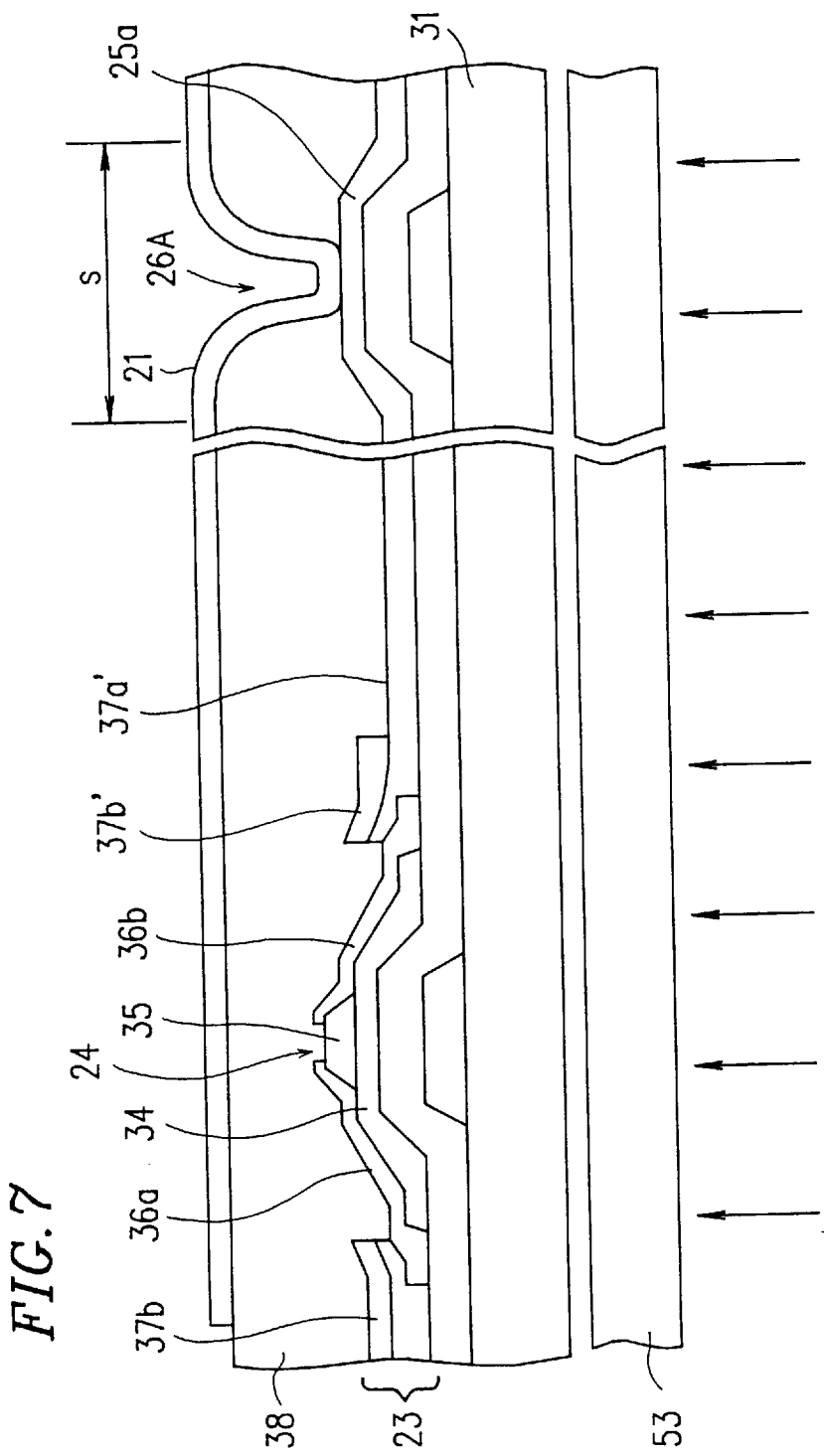
FIG. 7 is a cross-sectional view illustrating a structure where a micro prism sheet is disposed on the side of incident light in a liquid crystal display apparatus as a result of the development based on Example 3.

Furthermore, the viewing angle can be further improved by disposing a micro prism sheet 53 between a backlight source (not shown) and the substrate 31 closer to the backlight source on the side of incident light as shown in FIG. 7 (in FIG. 7, other components such as polarizing plates are not shown). The micro prism sheet was originally used for the purpose of improving luminance (refer to "Flat Panel Display, 1994" pp.217, Nikkei BP). In this example, BEF-90HP150 (a triangle prism) manufactured by 3M Ltd. and W518 (a wave prism sheet) manufactured by Sekisui Chemical Co., Ltd. are disposed. As a result, a liquid crystal display apparatus with no limitation in the right and left viewing angles, namely, a wide viewing angle that has not been believed possible can be obtained in such a simple manner that the interlayer insulating film is modified and design size rules and production conditions are optimized. However, there is no apparatus for measuring such a wide viewing angle; therefore satisfactory display was confirmed by viewing from the sides of the screen. Moreover, in order to produce the liquid crystal display apparatus of the present invention, it is sufficient to change a part of the specification of the conventional production lines. Thus, the cost for modifying the production lines can be minimized, and a small amount of facility investment suffices.

EXAMPLE 4

Figure 8:
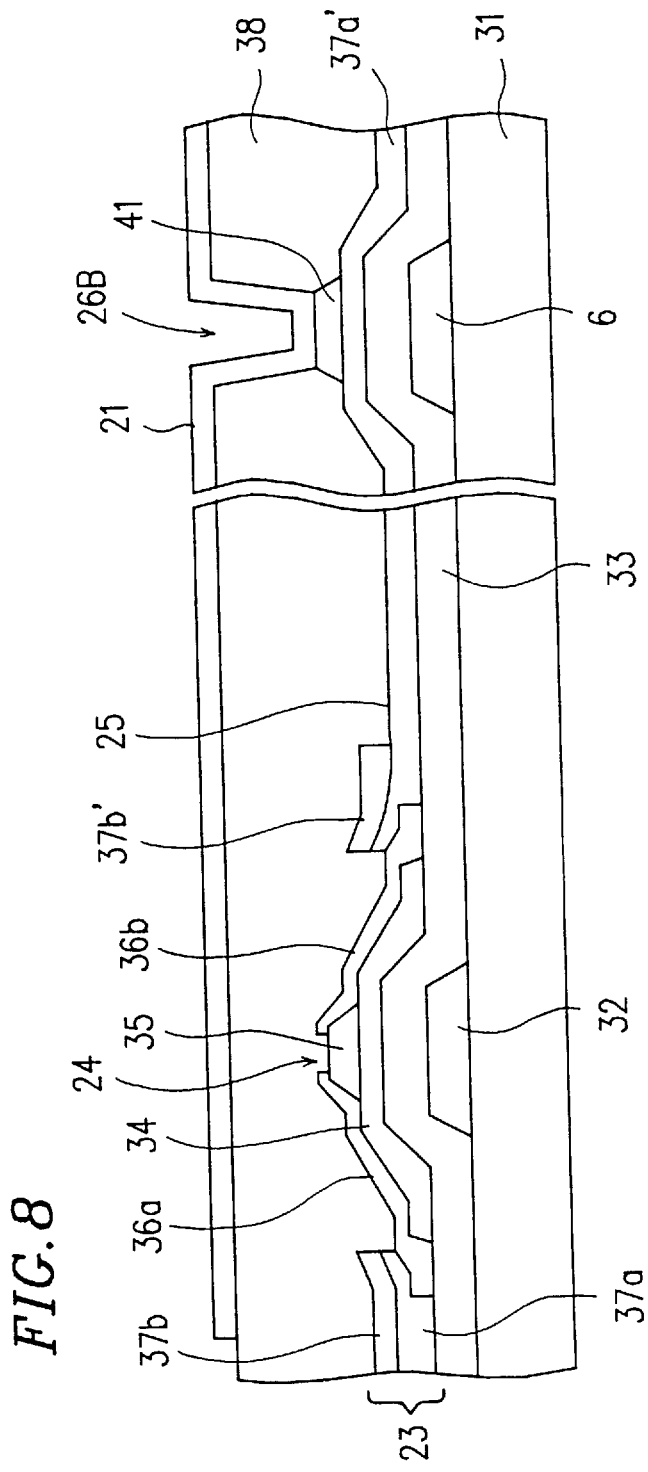
FIG. 8 is a plan view illustrating a structure of one pixel portion of an active matrix substrate of a transmissive liquid crystal display apparatus of Example 4 according to the present invention.

FIG. 8 is a partial cross-sectional view illustrating a structure of an active matrix substrate of a transmissive liquid crystal display apparatus of Example 4 according to the present invention.

In the active matrix substrate of Example 4, a contact hole 26B penetrating the interlayer insulating film 38 is formed above the storage capacitor common line 6, and a metal nitride layer 41 is formed on the transparent conductive film 37a' formed below the contact hole 26B.

The active matrix substrate having such a structure provides the following advantages:

Adhesion between a resin constituting the interlayer insulating film 38 and ITO or the like constituting the transparent conductive film or between a resin and a metal such as Ta and Al is not satisfactory. For example, in a cleaning process after the contact hole 26B is formed, a cleaning solution flows into the interface between the resin and the underlying film from the opening of the contact hole 26B, thereby causing the resin to peel. On the other hand, in the active matrix substrate of Example 4, the metal nitride layer 41 such as TaN and AlN which have satisfactory adhesion with the resin is formed. Therefore, there is no problem in adhesion such as peeling of the film.

The metal nitride layer 41 may be formed of any material, provided that it has a satisfactory adhesion with the resin constituting the interlayer insulating film 38, the interconnecting electrode 25 formed of a transparent conductive film and metals such as Ta and Al. However, the metal nitride layer 41 is required to have satisfactory conductivity because it is necessary to electrically connect the interconnecting electrode 25 and the pixel electrode 21.

Although a thin film transistor (TFT) is used as a switching device in Examples, the present invention is not limited thereto, but can be applied to other transmissive liquid crystal display apparatus using other types of switching devices such as MIMs and diodes.

In the Examples, the transmissive liquid crystal display apparatus with a structure where a storage capacitor electrode is connected to a counter electrode via the storage capacitor common line has been described. However, the same effect can be obtained with such a structure that storage capacitor electrode is the gate line of the adjacent pixel.

As described above, according to the present invention, a single or multi-layered interlayer insulating film formed of an organic or inorganic thin film is provided above a switching device, a scanning line and a signal line and a pixel electrode is provided on the interlayer insulating film. The interlayer insulating film has a surface with roughness (waviness or steps) of a height of about 50 nm or less. Thus a transmissive liquid crystal display apparatus having a wide viewing angle can be obtained.

In addition, the interlayer insulating film has a thickness in the range of about 1.5 μm to about 5 μm, a dielectric constant of about 2 to about 5, a transmittance of light with a wavelength in the range of about 400 nm to about 800 nm of about 90% or more. The pixel electrode is provided on the interlayer insulating film so that the periphery thereof overlaps at least one of the scanning line and the signal line. In addition, the pixel electrode and the corresponding electrode of the switching device are directly connected via a contact hole penetrating the interlayer insulating film, or connected via the contact hole and an interconnecting electrode extending from the corresponding electrode of the switching device to the contact hole. In this case, a transmissive liquid crystal display apparatus having a wide viewing angle of about 70° at the maximum and an excellent visibility and produced at a low cost can be provided. Furthermore, a single or multi-layered micro prism sheet is provided between a backlight source and the first or second substrate, thereby providing an epoch-making transmissive liquid crystal display apparatus having visibility when viewed from the side of the display screen, namely, having the same effect as a CRT which has no limitation in the viewing angle.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A transmissive liquid crystal display apparatus comprising: a liquid crystal layer interposed between a first substrate and a second substrate, the first substrate including gate lines, source lines and switching devices provided in a vicinity of intersectional portions of the gate lines and the source lines, the switching devices including gate electrodes connected to the gate lines, source electrodes connected to the source lines and drain electrodes connected to pixel electrodes for applying a voltage to the liquid crystal layer, wherein an interlayer insulating film having high transparency is provided above the switching devices, the gate lines and the source lines, the interlayer insulating film having roughness on its surface, a height difference of the roughness being 50 nm or less, and the pixel electrodes formed of a transparent conductive material are provided on the interlayer insulating film.

2. A transmissive liquid crystal display apparatus according to claim 1, wherein a thickness of the interlayer insulating film is in the range of about 1.5 $\mu$m to about 5 $\mu$m.

3. A transmissive liquid crystal display apparatus according to claim 1, wherein a transmittance of light with a wavelength of about 400 nm to about 800 nm of the interlayer insulating film is about 90% or more.

4. A transmissive liquid crystal display apparatus according to claim 1, wherein a dielectric constant of the interlayer insulating film is in the range of about 2 to about 5.

5. A transmissive liquid crystal display apparatus according to claim 1, further comprising interconnecting electrodes for connecting the pixel electrodes and the drain electrodes, wherein the interlayer insulating film is provided above the switching devices, the gate lines, the source lines and the interconnecting electrodes, the pixel electrodes are provided in the interlayer insulating film so as to at least partially overlap at least either the gate lines or the source lines, and the interconnecting electrodes and the pixel electrodes are connected to each other via contact holes penetrating the interlayer insulating film.

6. A transmissive liquid crystal display apparatus according to claim 5, further comprising capacitor lines formed substantially parallel to the gate lines in central portions of the pixel electrodes, and wherein the contact holes are formed over the capacitor lines.

7. A transmissive liquid crystal display apparatus according to claim 6, wherein a width of the contact hole in a direction lateral to the capacitor line does not exceed a width of the capacitor line by more than 2 $\mu$m.

8. A transmissive liquid crystal display apparatus according to claim 5, wherein the interconnecting electrodes are formed of a transparent conductive film.

9. A transmissive liquid crystal display apparatus according to claim 5, wherein a metal nitride layer for connecting the interconnecting electrodes and the pixel electrodes is provided below the contact holes.

10. A transmissive liquid crystal display apparatus according to claim 1, further comprising a micro prism sheet on a substrate side opposite to another substrate side that faces the liquid crystal layer.

11. A transmissive liquid crystal display apparatus according to claim 1, wherein a line-like patterned light-shielding layer for defining a size of a pixel is provided on at least one of the first substrate and the second substrate, the light-shielding layer being provided so as not to extend beyond the gate lines and the source lines.

12. A transmissive liquid crystal display apparatus according to claim 1, being a direct sight type, wherein a ratio of a shorter side of the display apparatus to a longer side of the display apparatus is substantially 9:16.

13. A method for producing a transmissive liquid crystal display apparatus comprising the steps of:

on the first substrate including gate lines, source lines and switching devices provided in a vicinity of intersectional portions of the gate lines and the source lines, the switching devices including gate electrodes connected to the gate lines, source electrodes connected to the source lines and drain electrodes connected to pixel electrodes for applying a voltage to a liquid crystal layer, forming an interlayer insulating film having roughness of a height difference of about 50 nm or less by applying a material of an initial viscosity of about 100 cps or less onto the switching devices, the gate lines and the source lines; and forming pixel electrodes formed of a transparent conductive material on the interlayer insulating film.

14. A method for producing a transmissive liquid crystal display apparatus according to claim 13, wherein a thickness of the interlayer insulating film is in a range of about 1.5 $\mu$m to 5 $\mu$m.

15. A method for producing a transmissive liquid crystal display apparatus according to claim 13, wherein a transmittance of light with a wavelength of about 400 nm to about 800 nm of the interlayer insulating film is about 90% or more.

16. A method for producing a transmissive liquid crystal display apparatus according to claim 13, wherein a dielectric constant of the interlayer insulating film is in the range of about 2 to about 5.

17. A method for producing a transmissive liquid crystal display apparatus according to claim 13, the first substrate further including interconnecting electrodes for connecting the pixel electrodes and the drain electrodes, the interlayer insulating film forming step being a step of forming the interlayer insulating film above the switching devices, the gate lines, the source lines and the interconnecting electrodes, further comprising the step of forming contact holes penetrating the interlayer insulating film, the pixel electrode forming step being a step wherein the pixel electrodes are provided in the interlayer insulating film so as to at least partially overlap at least either the gate lines or the source lines, and the interconnection electrodes and the pixel electrodes are electrically connected to each other via the contact holes.

18. A method for producing a transmissive liquid crystal display apparatus according to claim 13, wherein the interlayer insulating film is formed of a photosensitive material and is patterned by exposure and alkali development.

19. A method for producing a transmissive liquid crystal display apparatus according to claim 13, wherein the step of applying the material formed into the interlayer insulating film is performed by a spin coating method, a roll coating method or a slot coating method.

20. A method for producing a transmissive liquid crystal display apparatus according to claim 19, wherein a rotation rate in the spin coating method is in a range of about 800 rpm to about 1500 rpm.

* * * * *